(12) United States Patent
Andresen et al.

(10) Patent No.: US 6,211,693 B1
(45) Date of Patent: Apr. 3, 2001

(54) TESTABILITY CIRCUIT FOR CASCODE CIRCUITS USED FOR HIGH VOLTAGE INTERFACE

(75) Inventors: Bernhard H. Andresen, Dallas; Frederick G. Wall, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/212,137

(22) Filed: Dec. 15, 1998

Related U.S. Application Data
(60) Provisional application No. 60/068,582, filed on Dec. 23, 1997.

(51) Int. Cl.[7] .................................................. G01R 31/26
(52) U.S. Cl. ........................................ 324/769; 324/158.1
(58) Field of Search .................................. 324/769, 73.1, 324/158.1, 500, 512, 537; 326/80, 83, 91, 112

(56) References Cited

U.S. PATENT DOCUMENTS

| | | | |
|---|---|---|---|
| 4,680,486 | * 7/1987 | Price et al. | 326/126 |
| 5,821,799 | * 10/1998 | Saripella | 327/333 |
| 5,995,010 | * 11/1999 | Blake et al. | 340/653 |
| 6,005,415 | * 12/1999 | Solomon | 326/83 |

* cited by examiner

Primary Examiner—Safet Metjahic
Assistant Examiner—Minh Tang
(74) Attorney, Agent, or Firm—Robert D. Marshall, Jr.; W. James Brady, III; Frederick J. Telecky, Jr.

(57) ABSTRACT

A test circuit (10) is provided to enable testing for faults in internal cascode transistors Q2 and Q3, which form part of, for example, a level shifting circuit. Test circuit (10) is comprised of test transistors Q6 and Q7 connected to regulating transistors Q5 and Q8. When Q2 and Q3 are functioning properly, no current flow through test circuit (10). If, however, either or both of Q2 or Q3 has a drain to source short, current flows through test circuit (10) thus providing an indication of the fault.

3 Claims, 1 Drawing Sheet

TESTABILITY CIRCUIT FOR CASCODE CIRCUITS USED FOR HIGH VOLTAGE INTERFACE

This application claims priority under 35 USC § 119 (e)u) of Provisional Application No. 60/068,582 filed Dec. 23, 1997.

TECHNICAL FIELD OF THE INVENTION

This invention relates generally to testability circuits. More specifically, this invention relates to testability for cascode circuits used as high voltage interfaces.

BACKGROUND OF THE INVENTION

Newer technology devices, e.g., CMOS devices, which utilize lower operating voltages, are becoming pervasive. Nevertheless, there is still a need to interface with older technology devices. These older devices typically have higher operating ranges, e.g., 4.5 V to 5.5 V which are generally higher than a single transistor can tolerate. In some cases, buffer circuits, designed to tolerate this higher voltage, are used to interface with these older devices. These high voltage tolerant buffer circuits, however, are inappropriate for some newer CMOS devices that are required to use level shifting to interface to the higher voltage levels.

Some of the lower voltage devices contain level shift outputs to interface with devices having higher operating voltages. These level shift outputs use transistors that tolerate five volts. Level shifting can also be accomplished using cascode transistors to maintain acceptable voltage stress levels on the switching transistors. If, however, a cascode transistor is faulty, e.g., has a drain to source short, then the switching transistor will, generally, fail due to voltage stress. Conventional cascode design does not allow a faulty cascode device to be readily detected. Thus, although a conventional cascode configuration will likely perform appropriately during testing, it will fail prematurely in the field due to voltage overstress.

SUMMARY OF THE INVENTION

Therefore, a need has arisen for a testability circuit for cascode devices used in high voltage interface circuits. A testability circuit according to the present invention enables a determination to be made as to whether internal cascode transistors are operating properly before they enter the field.

According to one embodiment of the present invention, a level shifting circuit having a testability network is disclosed. The level shifting circuit includes a cascode configuration of active devices and a bias network arranged to bias the cascode configuration. The cascode configuration includes at least a first switching transistor and a second switching transistor and a first cascode transistor and a second cascode transistor arranged to limit voltage stress on said first and second switching transistors. A test network is connected to the cascode configuration and the bias network such that it provides an indication of a short circuit in one or both of the cascode transistors.

According to another embodiment of the present invention a testability circuit for cascode devices is disclosed. The testability circuit includes at least one test transistor pair, and a biasing transistor pair. Each test transistor pair comprises a first test transistor and a second test transistor. The drain of the first test transistor is connected to the source of the second test transistor, and the source of the first test transistor is connected to the drain of the second test transistor.

The biasing transistor pair comprises a first biasing transistor and a second biasing transistor connected to the first and second test transistors of one test transistor pair to limit voltage stress on said first and second test transistors. When one of said test transistor pairs is connected to a cascode circuit arrangement, the testability circuit according to this embodiment provides an indication of a fault in said cascode circuit arrangement.

The above-described embodiments of the present invention provide various technical advantages. For example, the testability circuit according to the above-described embodiments provides the technical advantage of allowing the cascode devices to be tested. In addition, the testability circuits according to the above-described embodiments increase the reliability of level shifting circuits which use cascode devices helping to ensure that such level shifting circuits do not fail prematurely in the field. Other technical advantages are apparent to one skilled in the art from the following figures, description and claims.

BRIEF DESCRIPTION OF THE DRAWINGS

The features and objects of the present invention, and the manner of attaining them is explained in detail in the following DETAILED DESCRIPTION OF THE INVENTION when taken in conjunction with the accompanying drawings wherein.

DETAILED DESCRIPTION OF THE INVENTION

Transistors in cascode circuit arrangements, among other things, are effectively used to limit voltage stress on switching devices. In such circuit arrangements, a problem arises if a cascode transistor has a fault because the switching device will be subjected to whatever voltage stress the cascode device was designed to limit. A test circuit according to the embodiments of the present invention enables internal transistors to be tested for faults, e.g., drain to source shorts before they are sent to the field and thereby improve circuit reliability in the field. The test circuit according to the embodiments of the present invention will be explained in conjunction with a cascode configuration used in a level shifting circuit. It should, however, be understood that test circuits according to the embodiments of the present invention are useful in conjunction with a number of different circuit arrangements.

Figure 1:
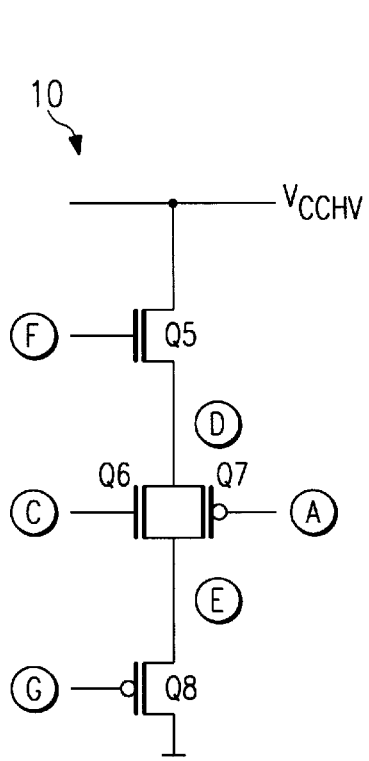
FIG. 1 represents a circuit schematic of a test circuit for a level shifting circuit according to one embodiment of the present invention.
Figure 2:
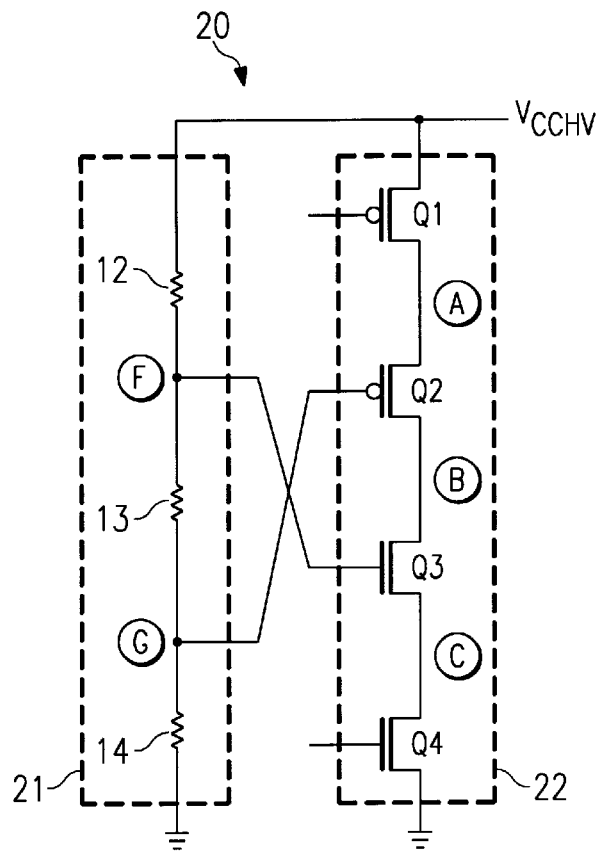
FIG. 2 represents a circuit schematic of a level shifting circuit with which a test circuit according to one embodiment of the present invention may be used.

FIG. 1 illustrates a test circuit 10 for use with a level shifting circuit 20 shown in FIG. 2. Level shifting circuit 20 performs the function of allowing higher voltage devices to be interfaced to lower voltage devices and is comprised of a bias network 21, and a switching network 22. Switching network 22 of level shifting circuit 20 utilizes cascode transistors Q2 and Q3 in a cascode topology to limit the voltage stress on switching transistors Q1 and Q4. Bias network 21 sets the threshold voltages for transistors Q1, Q2, Q3 and Q4. The bias voltages are chosen to protect the individual transistors from overstress, keep the test circuitry at leakage current levels, and maximize output switching performance. For one particular embodiment of the circuit in FIG. 2, assume $V_{CCHV}$ is 5 V and the maximum transistor stress level is 3.3 V. Optimal performance is obtained with maximum Vgs on cascade transistors Q2 and Q3. The bias voltages would then be F=3.3 V and G=(5−3.3)=1.7 V. A check is required to determine whether these voltages are compatible with the test circuitry.

The source of switching transistor Q1 is connected to the high voltage power supply, $V_{CCHV}$, the drain of transistor Q1 is connected to the source of cascode transistor Q2, and the gate of switching transistor Q1 ties to an earlier stage predriver circuit operating between $V_{CCHV}$ and voltage G. The drain of transistor Q2 is connected to the drain of cascode transistor Q3 and the gate of transistor Q2 is connected to the bias network at contact point G. The source of transistor Q3 is connected to the drain of switching transistor Q4 and the gate of transistor Q3 is connected to bias network 21 at contact point F. The gate switching transistor of Q4 ties to an earlier stage predriver circuit operating between voltage F and ground. In one particular embodiment of level shifting circuit, switching transistors Q1 and Q4 are PMOS and, NMOS transistors respectively, and cascode transistors Q2 and Q3 are PMOS and NMOS transistors respectively. It should be recognized, however, that the particular level shifting circuit arrangement and the choice of specific types of transistors is for example purposes only. Other circuit configurations and transistor types are possible.

Bias network 21 activates cascode transistors, Q2 and Q3, and regulates the drain to source voltage drop for Q2 and Q3 so that they limit the voltage range which switching transistors Q1 and Q4 are subjected to. In the embodiment shown in FIG. 2, bias network 21 comprises of a series of resistors 12, 13, and 14 connected between high voltage power supply $V_{CCHV}$ and ground. Resistors 12, 13, and 14 divide the high voltage power supply voltage, $V_{CCHV}$, and thus provide contact points F and G having voltages appropriate for operation of transistors Q2 and Q3. As can be seen in FIG. 2, the voltages from contact points F and G are used to drive the gates of cascode transistors, Q3 and Q2 respectively. Although bias network 21 is shown as a resistor network in FIG. 2, bias network 21 could also be comprised of, e.g., transistors that may be configured to provide a similar type of resistor network. Typically, node B is the only node available on a bond pad for output from switching network 22, thus necessitating the use of a test circuit.

One embodiment of test circuit 10 is shown in FIG. 1. Test circuit 10 is comprised of two test transistors Q6 and Q7, and two biasing transistors Q5 and Q8. The drains of test transistors Q6 and Q7 are connected to a common node and the sources of test transistors Q6 and Q7 are connected to a common node. The drain of a first biasing transistor Q5 is connected to $V_{CCHV}$, and the source of transistor Q5 is connected to the drains of test transistors Q6 and Q7. The source of a second biasing transistor Q8 is connected to the sources of test transistors Q6 and Q7, and the drain of transistor Q8 is connected to ground. The gates of the biasing transistors Q5 and Q8 are connected to contact points F and G of bias network 21 so that transistors Q5 and Q8 are biased to conduct current if one of test transistors Q6 or Q7 is activated.

In this configuration, test transistor Q6 and Q7 control current flow through test circuit 10 by acting as switches controlled by the voltages at contact points C and A respectively. Biasing transistors Q5 and Q8 serve the dual purposes of setting the threshold voltages for test transistors Q6 and Q7 and limiting the voltage stress on test transistors Q6 and Q7. In this embodiment of test circuit 10, biasing transistor Q5 and test transistor Q6 are NMOS transistors and biasing transistor Q8 and test transistor Q7 are PMOS transistors. It should be recognized, however, that the type of transistors used for Q5, Q6, Q7, and Q8 is determined by a number of factors, including for example, the type of transistor used for cascode transistors Q2 and Q3 and the specifications of the particular circuit with which test circuit 10 is being used.

The operation of test circuit 10 can best be understood with reference to FIGS. 1 and 2. As stated above, test circuit 10 provides an indication of a fault, e.g., a drain to source short, in either of cascode transistors Q2 or Q3. That is, as long as cascode transistors Q2 and Q3 are functioning normally, the voltage at contact point C is not high enough to turn on Q6, and the voltage at contact point A is not low enough to turn on Q7. Therefore, as long as Q2 and Q3 function normally, test transistors Q6 and Q7 remain, essentially, open circuits and therefore, no current flows through test circuit 10. This is verified as follows. If the turn-on voltage of the NMOS transistor is 0.6 V and G is at the aforementioned 1.7 V then E would have to be greater than (1.7+0.6)=2.3 V for current to flow. If the current flows through Q6 then the voltage at C would have to be greater than (2.3+0.6)=2.9 V. Since Q3 acts as a source follower the voltage at C is equal to F−0.6 V=2.7 V which is less than the calculated 2.9 V required to sustain current flow in the test circuit. In a like manner, it can be shown that current is not flowing through Q7 so the test circuit is not loading $V_{DDHV}$. In this specific example the margins are very tight, and some adjustment of the voltage levels at F and G would be desirable to guarantee the test circuit doesn't draw current.

If, however, there is a drain to source short in one of cascode transistors Q2 or Q3, test circuit 10 will provide an indication of such short. For example, if Q2 has a drain to source short, the voltage at contact point A is pulled to ground when Q4 is on. If the voltage at contact point A is pulled to ground, then Q7 turns on and current flows through test circuit 10 from $V_{DDHV}$ to ground. The test circuit is designed such that this current is large enough to be detected and thus the current flow provides an indication of a fault in Q2 or Q3. If Q3 has a drain to source short, the voltage at contact point C is pulled to $V_{CCHV}$ when Q1 is on. If the voltage at contact point C is pulled to $V_{CCHV}$, then Q6 turns on also causing current to flow through test circuit 10. Therefore, test circuit 10 enables a fault in an internal cascode device to be detected at the unit test stage and thereby enhances the reliability of circuits incorporating such cascode transistors.

Figure 3:
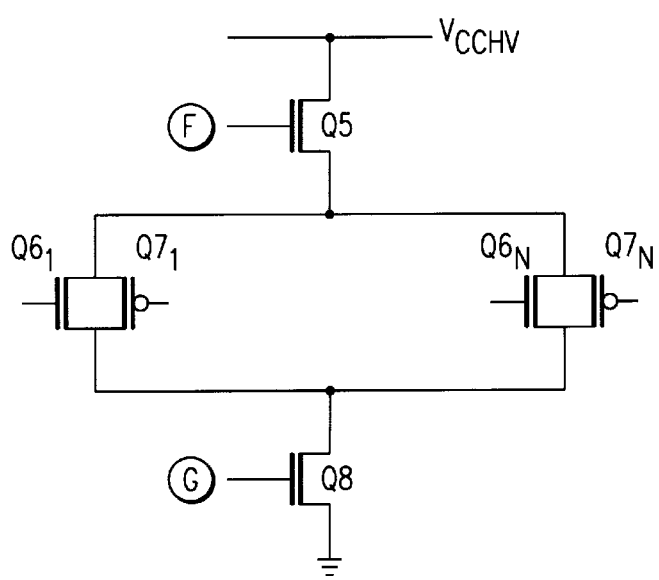
FIG. 3 represents a circuit schematic of a test circuit for multiple level shifting circuits according to one embodiment of the present invention.

In another embodiment, a plurality of test transistor pairs, $Q6_1$ and $Q7_N$ could be grouped with regulating transistors Q5 and Q8. As shown in FIG. 3, the test transistor pairs are connected such that they are connected to regulating transistors Q5 and Q8 at common nodes. In this arrangement, each test transistor pair is used to test for faults in one particular pair of cascode devices. The plurality of test transistor pairs provide for testing of multiple cascode output transistor circuits.

Although the present invention has been described in detail, it should be understood that various changes, substitutions, and alterations can be made without departing from the intended scope as defined by the appended claims.

What is claimed is:

1. A testable cascode output buffer circuit used with an external voltage greater than a maximum voltage stress level of a single transistor, said output buffer circuit comprising:

a bias network connected between the external voltage and ground, said bias network producing a first bias voltage equal to the maximum voltage stress level and a second bias voltage equal to a difference between the external voltage and the maximum voltage stress level;

a cascode configuration of active devices including a first switching transistor having a source connected to the external voltage, a gate connected to a first input and a drain connected to a first intermediate node, a first cascode transistor having a source connected to the first intermediate node, a gate connected to said second bias voltage and a drain connected to an output node of said output buffer circuit, a second cascode transistor having a source connected to said output node, a gate connected to said first bias voltage and a drain connected to a second intermediate node, and a second switching transistor having a source connected to said second intermediate node, a gate connected to a second input and a drain connected to ground; and a test circuit indicating normal operation of said first and second cascode transistors by not conducting and indicating a short of either said first cascode transistor or said second cascode transistor by conducting, said test circuit including a first biasing transistor having a source connected to the external voltage, a gate connected to said first bias voltage and a drain connected to a third intermediate node, a first test transistor having a source connected to said third intermediate node, a gate connected to said first intermediate node and a drain connected to a fourth intermediate node, a second test transistor having a source connected to said third intermediate node, a gate connected to said second intermediate node and a drain connected to said fourth intermediate node, and a second biasing transistor having a source connected to said fourth intermediate node, a gate connected to said second bias voltage and a drain connected to ground.

2. The output buffer circuit in claim 1, wherein:

said first input has a voltage between said external voltage and said second bias voltage; and said second input has a voltage between said first bias voltage and ground.

3. The output buffer circuit in claim 1, wherein the first switching transistor, the first cascode transistor, the second biasing transistor and the first test transistor are PMOS transistors and the second switching transistor, the second cascode transistor, the first biasing transistor and the second test transistor are NMOS transistors.

* * * * *